US010822720B1

(12) United States Patent
Park et al.

(10) Patent No.: US 10,822,720 B1
(45) Date of Patent: Nov. 3, 2020

(54) COMPOSITION FOR PREPARING SILICON CARBIDE INGOT AND METHOD FOR PREPARING SILICON CARBIDE INGOT USING THE SAME

(71) Applicant: SKC Co., Ltd., Suwon-si (KR)

(72) Inventors: Jong Hwi Park, Suwon-si (KR); Myung-Ok Kyun, Suwon-si (KR); Sang Ki Ko, Suwon-si (KR); Kap-Ryeol Ku, Suwon-si (KR); Jung-Gyu Kim, Suwon-si (KR); Jongmin Shim, Hwaseong-si (KR); Byung Kyu Jang, Suwon-si (KR); Jung Woo Choi, Suwon-si (KR)

(73) Assignee: SKC Co., Ltd., Suwon-si (KR)

( * ) Notice: Subject to any disclaimer, the term of this patent is extended or adjusted under 35 U.S.C. 154(b) by 0 days.

(21) Appl. No.: 16/887,263

(22) Filed: May 29, 2020

(30) Foreign Application Priority Data

Jul. 11, 2019 (KR) .......................... 10-2019-0083910

(51) Int. Cl.
| | |
|---|---|
| *C30B 23/00* | (2006.01) |
| *C30B 29/36* | (2006.01) |
| *C30B 25/08* | (2006.01) |
| *H01L 21/02* | (2006.01) |
| *C30B 19/08* | (2006.01) |
| *C30B 35/00* | (2006.01) |
| *C30B 25/10* | (2006.01) |

(52) U.S. Cl.
CPC .............. *C30B 29/36* (2013.01); *C30B 19/08* (2013.01); *C30B 25/08* (2013.01); *C30B 25/10* (2013.01); *C30B 35/002* (2013.01); *H01L 21/02002* (2013.01)

(58) Field of Classification Search
CPC ....... C30B 23/00; C30B 23/002; C30B 23/06; C30B 29/36
See application file for complete search history.

(56) References Cited

U.S. PATENT DOCUMENTS

| | | | | | |
|---|---|---|---|---|---|
| 4,699,202 | A | * | 10/1987 | Gilles | .................. B22D 11/225 164/414 |
| 10,525,000 | B2 | * | 1/2020 | Constantine | ......... A61K 8/9794 |

(Continued)

FOREIGN PATENT DOCUMENTS

| | | |
|---|---|---|
| JP | 2013-067523 A | 4/2013 |
| JP | 2019-052085 A | 4/2019 |

(Continued)

OTHER PUBLICATIONS

Korean Office Action dated Nov. 12, 2019 in corresponding Korean Patent Application No. 10-2019-0083910 (11 pages in English, 7 pages in Korean).

(Continued)

*Primary Examiner* — Robert M Kunemund
(74) *Attorney, Agent, or Firm* — NSIP Law

(57) ABSTRACT

A method for preparing a SiC ingot includes loading a composition of a raw material comprising a carbon source and a silicon source into a reactor; placing a plurality of seed crystal on one side of the reactor spaced apart from the composition; and sublimating the composition such that the SiC ingot grows from the plurality of seed crystal. A flow factor of the composition may be 5 to 35.

7 Claims, 2 Drawing Sheets

(56) References Cited

U.S. PATENT DOCUMENTS

2016/0108553 A1   4/2016  Harada et al.
2017/0199092 A1   7/2017  Kojima et al.

FOREIGN PATENT DOCUMENTS

| KR | 10-2016-0036527 A | 4/2016 |
| KR | 10-1809642 B1 | 12/2017 |
| KR | 10-1854731 B1 | 5/2018 |
| WO | WO 2015/181971 A1 | 12/2015 |

OTHER PUBLICATIONS

Korean Decision to Grant dated Jan. 12, 2020 in corresponding Korean Patent Application No. 10-2019-0083910 (2 pages in English, 3 pages in Korean).

Craven et al., "Investigation into the Flow Properties of Coarse Solid Fuels for Use in Industrial Feed Systems," Journal of Powder Technology, vol. 2015, Article ID 786063, 2015, pp. 1-12.

\* cited by examiner

COMPOSITION FOR PREPARING SILICON CARBIDE INGOT AND METHOD FOR PREPARING SILICON CARBIDE INGOT USING THE SAME

CROSS-REFERENCE TO RELATED APPLICATIONS

This application claims the benefit under 35 U.S.C. 119(a) of Korean Patent Application No. 10-2019-0083910 filed on Jul. 11, 2019, in the Korean Intellectual Property Office, the entire disclosure of which is incorporated herein by reference for all purposes.

BACKGROUND

1. Field

The present disclosure relates to a composition for preparing a silicon carbide ingot including silicon carbide particles, a method for preparing a silicon carbide ingot using the same, and the like.

2. Description of the Background

Materials for a broadband semiconductor, such as a silicon carbide (SiC), a gallium nitride (GaN), and an aluminum nitride (AlN), have been studied as materials for a next-generation semiconductor device. Single crystal SiC has a large energy band gap and its break field voltage and thermal conductivity are superior to silicon (Si). In addition, a carrier mobility of a single crystal SiC is comparable to that of a silicon, and a saturation drift rate and a breakdown voltage of electrons are also large. Due to such characteristics, a single crystal SiC is being applied to applications such as control of electric cars, power control of power conditioners for solar or wind power generation, and the like.

As a method for preparing a SiC single crystal, there are Liquid Phase Epitaxy (LPE), Chemical Vapor Deposition (CVD), Physical Vapor Transport (PVT), and the like.

The PVT is also called a sublimation method, and it is most widely used because it can produce ingot shaped SiC with a high growth rate.

As a method for producing a SiC, for example, Korean Patent Publication No. 10-1809642 discloses a method including disposing a seed crystal of a SiC single crystal coated with a carbon-based protective film in a reactor and growing the SiC single crystal from a SiC raw material on the seed crystal. In addition, there are attempts to manufacture large diameter single crystal ingots without substantial defects.

In order to grow a high-quality single crystal ingot with few defects, it is necessary to control the properties of the raw material loaded in the reactor. The raw material in powder form in a reactor undergoes large changes of temperature and pressure change in the reactor, and a resultant change in behavior of the raw material may cause defects in the ingot. Korean Patent Publication No. 10-1854731 discloses a method for applying an aggregated material in a granulated form.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for preparing a SiC ingot includes: loading a composition of a raw material containing a carbon source and a silicon source into a reactor; placing a plurality of seed crystal on one side of the reactor spaced apart from the composition; and sublimating the composition such that the SiC ingot grows from the plurality of seed crystal.

The carbon source may include a high carbon resin, and the silicon source may include silicon particles.

The composition may be a powder including SiC particles.

A flow factor of the powder may be 5 to 35.

A $D_{50}$ of the powder may be 10 µm to 800 µm.

When the powder is compressed by applying a pressure of 8 kPa, a ratio of a change in an internal friction angle after the compression to an internal friction angle before the compression may be 5% to 18%.

A number of a surface pit of the SiC ingot may be 10 $K/cm^2$ or less.

A caliber of the SiC ingot may be 4 inches or more.

A caliber of the SiC ingot may be 6 inches or more.

The SiC ingot may include a 4H SiC single crystal.

A surface of the SiC ingot may be convex or flat.

In another general aspect, a SiC ingot for preparing a SiC wafer may have a locking angle of the SiC wafer obtained from the SiC ingot with an off angle of 4 degree with respect to a (0001) plane may be −1.5 to +1.5 degree.

A number of a surface pit of the SiC ingot may be 10 $K/cm^2$ or less.

A caliber of the SiC ingot may be 4 inches or more.

A caliber of the SiC ingot may be 6 inches or more.

The ingot may include a 4H SiC single crystal.

A surface of the SiC ingot may be convex or flat.

In another general aspect, a composition of a raw material for preparing a SiC ingot generates a flow when a predetermined pressure is applied and a flow factor upon change of the predetermined pressure is 5 to 35.

The composition may be a powder including SiC particles.

A $D_{50}$ of the powder may be 10 µm to 800 µm.

When the powder is compressed by applying a pressure of 8 kPa, a ratio of a change in an internal friction angle after the compression to an internal friction angle before the compression may be 5% to 18%.

Other features and aspects will be apparent from the following detailed description, the drawings, and the claims.

BRIEF DESCRIPTION OF THE DRAWINGS

In FIG. 2, E1 to E6 are Examples 1 to 6, and CE1 is Comparative Example 1, respectively.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
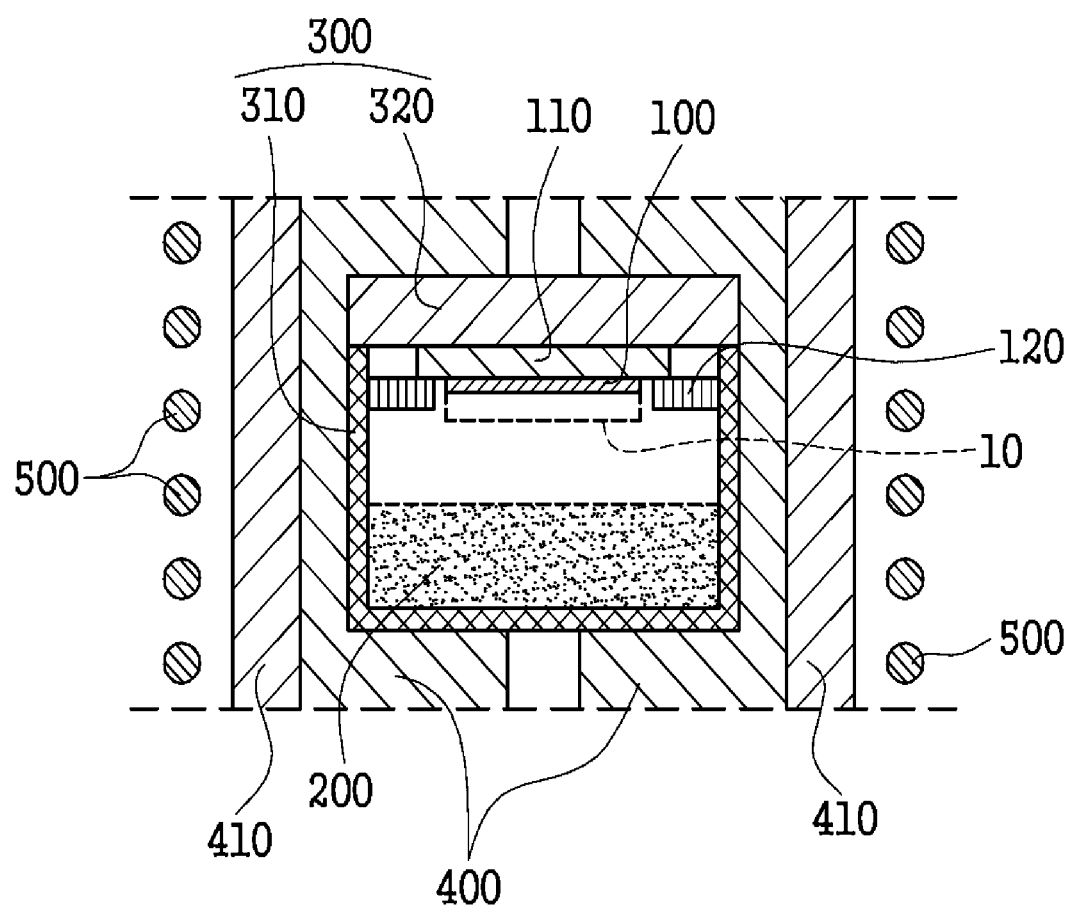
FIG. 1 is a conceptual view illustrating a structure of a device for preparing an ingot.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, the phrase that a certain element "comprises" or "includes" another element means that the certain element may further include one or more other elements but does not preclude the presence or addition of one or more other elements, unless stated to the contrary.

In the drawings, thicknesses are enlarged to clearly represent various layers and regions. In the drawings, thicknesses of some layers and regions are exaggerated for convenience of description. The same reference numeral refers to the same components throughout the specification.

As used herein, the term "and/or" includes any one and any combination of any two or more of the associated listed items; likewise, "at least one of" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Throughout the present specification, an off angle of X degrees means that it has an off angle evaluated as X degrees from a reference plane within a general error range, and for example, it includes an off angle in a range from (X−0.05 degrees) to (X+0.05 degrees). In the case of 4H SiC, a (0001) plane may be applied as the reference plane.

Throughout the present specification, the locking angle "1 to +1 degree" means −1 to +1 degree relative to a reference angle, even if not mentioned otherwise.

Throughout the present specification, the locking angle "−1 to +1 degree relative to a reference angle" means that a value of a full width at half maximum (a FWHM value) is in the range from (peak angle−1 degree) to (peak angle+1 degree) with respect to the peak angle which is the reference angle.

An aspect of the present disclosure is to provide a composition of a raw material for preparing a SiC ingot, which is capable of effectively growing a SiC ingot having good quality and with few or substantially no defects, a method for preparing a SiC ingot using the same, and the like.

The crystal structure of SiC prepared by applying a physical vapor transport method (PVT) may have various crystal phases, and typically includes 3C-SiC, 4H-SiC, 6H-SiC, and 15R-SiC. In order to manufacture a single crystal ingot, it is important to minimize the generation of crystal phases (heterogeneous crystal phases) other than the target crystal phase. This is because when heterogeneous crystal phases are mixed, one or more of crystal defects such as micropipe defects, a basal plane dislocation (BPD), a threading edge dislocation (TED), and a threading screw dislocation (TSD) may occur due to the crystal mismatch, which greatly deteriorate quality.

The inventors paid attention to the properties of the raw material powder as one of the factors causing defects. The conventional methods of growing an ingot by a physical vapor transport do not consider the flowability affected by changes in an external environment (temperature and/or pressure) of the raw material powder. If the collision behavior and the hardening behavior between the microscopic surface regions of the particles change due to changes in the external environment, a partial bias may occur during the sublimation process, and the in-plane composition of the sublimation gas generated during the sublimation process may not be uniform.

In general, the particle size is indicated by D10, D50, D90, etc., which means the size corresponding to 10%, 50%, and 90%, respectively, of the largest value in the cumulative distribution of particles. The inventors found out one of the reasons that the qualities of the grown ingots are not same with each other even if the raw material particles having similar size are used to prepare the ingots. Particularly, the inventors confirmed that, since crystal growth is necessarily accompanied by a change of pressure, the flow factor of the raw material powder depending on the change of pressure is important. The inventors confirmed that a SiC with higher quality can be manufactured based on this finding.

FIG. 1 is a conceptual view illustrating a structure of a device for preparing an ingot. Hereinafter, various embodiments of the present disclosure will be described in more detail with reference to the accompanying drawings.

A method for preparing a SiC ingot according to one embodiment, which manufactures a SiC ingot including 4H SiC, includes a preparation step and a growth step.

A method for preparing a SiC ingot includes: loading a composition of a raw material containing a carbon source and a silicon source into a reactor; placing a plurality of seed crystal on one side of the reactor spaced apart from the composition; and sublimating the composition such that the SiC ingot grows from the plurality of seed crystal. The powder may have a flow factor of 5 to 35, which is calculated according to the following Equation 1.

In the preparation step, a crucible assembly 300 including a crucible body 310 having an internal space and a crucible cover 320 covering the crucible body 310 is prepared, the composition of a raw material 200 is loaded into the internal space of the crucible assembly 300, and a plurality of a SiC seed crystal 100 is placed in the internal space of the crucible assembly 300 at regular intervals spaced apart from the composition.

The crucible body 310 may be, for example, a cylindrical shape having an opening at an upper side, and may have a structure capable of loading the composition of the raw material 200 having powder shape therein.

The crucible body 310 and the crucible cover 320 may include a graphite.

The SiC seed crystal 100 may be placed over the composition of the raw material, for example, by a method such as directly attaching to the crucible cover 320 or directly fixing to a cradle 120 disposed in the crucible body. In such a case, a separate seed holder 230 is not applied, and the crucible cover 320 may be integrated with the seed holder.

The SiC seed crystal 100 may be placed by directly bonding to the seed crystal holder 110.

In detail, the seed crystal holder 110, to which the seed crystal 100 is attached, may be disposed on the cradle 120, which is located between the crucible body 310 and the crucible cover 320.

The composition of the raw material 200 includes a carbon source and a silicon source, and it may be a powder. The powder 200 may include SiC particles. Specifically, the powder 200 may include a carbon-silicon source or may further include a carbon source and/or a silicon source. The carbon source may be a high carbon resin (ex: phenol resin) and the like, and silicon particles may be used as the silicon source, but are not limited thereto. Specifically, the powder may include SiC particles.

In one embodiment, the particle diameter (D50) of the powder 200 may be, for example, 10 μm to 800 μm, for example, 30 μm to 650 μm, for example, 60 μm to 600 μm, for example, 80 μm to 500 μm, for example, 100 μm to 470 μm.

The powder 200 may have a flow factor (FF) of 5 to 35, which is calculated from Equation 1 below, and may be, for example, 7 to 32.

$$Y=aX+b, FF=1/a$$ [Equation 1]

The flow factor (FF) according to Equation 1 is calculated as follows: After the powder is condensed by applying a predetermined pressure (consolidation stress, CS) in the confined space, the confined space is released, and then the pressure at which the condensation collapses (Unconfined Failure Strength, UFS) is measured. A slope of a trend line is obtained when the CS is set as X-axis and the UFS is set as Y-axis, then the reciprocal of the slope is defined as the flow factor. FF may be measured using, for example, PFT™ equipment from Brookfield.

Even if the average size of the powders is similar, the FF values may not be similar. This is because the particle size of all powders is not the same or uniform, and is generally distributed within a specific range. Also, the shape of each particle is not the same, and the collision and hardening behavior between the microscopic surface regions of the particle are changed by an external environment (temperature and pressure).

When the FF value is less than 5, there is almost no flow of the raw material powder even by applying a pressure change, such that an imbalance of the raw material powder to be sublimed may increase. When the FF value is more than 35, the flowability of the raw material powder is maximized even by a minute pressure change, such that a composition in the growth surface of the sublimation gas, which is generated during the growth stage, may be non-uniform.

In one embodiment, the composition of the raw material is a powder, and it is more advantageous to manufacture ingots with desired property levels by simultaneously satisfying the range of the particle size (D50) and the range of the FF value according to equation 1, as described above.

The internal friction angle of the powder 200 before compression may be 30° to 40°. After an 8 kPa compression, the internal friction angle of the powder 200 may be 30° to 35°.

The amount of change in the internal friction angle is defined by Equation (2) below. The powder may have a ratio of a change in an internal friction angle after the compression to an internal friction angle before the compression as 5% to 18%.

$$\text{The ratio of change in the internal friction angle} = \frac{(\text{The internal friction angle before compression} - \text{The internal friction angle after the 8 } kPa \text{ compression})}{\text{The internal friction angle before compression}} \times 100$$ [Equation 2]

If the ratio of a change in an internal friction angle after the compression to an internal friction angle before the compression is less than 5%, there may be little flowability of the powder even by applying a pressure change. If the ratio of a change in an internal friction angle after the compression to an internal friction angle before the compression is more than 18%, it may cause a problem in flowing of the powder resulting in an unevenness of the powder. The internal friction angle before and after compression may be measured using, for example, PFT™ equipment from Brookfield.

When the powder having the FF value and/or the amount of change in the internal friction angle described above is used in the method of the embodiment, it is possible to grow SiC ingots with an excellent crystallinity and an excellent pit value of the ingot surface, which may be evaluated by the locking angle.

In the growth step, the internal space of the crucible body 310 is adjusted to a crystal growth atmosphere such that the composition of the raw material is vapor-transported and deposited to the SiC seed, and a SiC ingot may be grown from the SiC seed.

The growth step includes a process of adjusting the internal space of the crucible body 310 to a crystal growth atmosphere. Specifically, a reactor (not shown) including the crucible assembly 300 and a heat insulating material 400 surrounding the crucible assembly 300 is prepared by wrapping the crucible assembly 300 with the heat insulating material 400, and the growth step may be performed by placing the reactor in a reaction chamber such as a quartz tube and then heating the reactor by a heating means 500.

The reactor is located in the reaction chamber. The heating means 500 induce the internal space of the crucible body 310 to a temperature suitable for the crystal growth atmosphere. Such a temperature is one of the important factors in the crystal growth atmosphere, and by controlling conditions such as pressure and gas movement, a more suitable crystal growth atmosphere may be created. The heat insulating material 400 is located between the reaction chamber and the reactor to facilitate the creation and control of the crystal growth atmosphere.

The heat insulating material 400 may affect the temperature gradient inside the crucible body 310 or inside the reactor in the growth atmosphere. The heat insulating material 400 may include a graphite, and specifically, the heat insulating material 400 may include a rayon-based graphite felt or a pitch-based graphite felt.

The crystal growth atmosphere may be created from heating by the heating means 500 outside the reaction chamber. The crystal growth atmosphere may be created by simultaneously or separately reducing the pressure with the heating to remove air from the reaction chamber or crucible. The crystal growth atmosphere may be a pressurized/decompressed atmosphere and/or under an inert atmosphere (eg, Ar atmosphere, $N_2$ atmosphere, or a mixed atmosphere thereof).

The crystal growth atmosphere allows the raw material 200 to be vapor-transported to the surface of the SiC seed 100, thereby inducing the growth of the SiC crystal. In the crystal growth atmosphere, the SiC crystal grows to form the SiC ingot 100.

The crystal growth atmosphere may have a growth temperature of 2000 to 2500° C. and a growth pressure of 1 to 200 torr. When such temperature and pressure are applied, the SiC ingot 100 can be more efficiently manufactured.

In one embodiment, a growth rate of the SiC ingot 100 during the ingot growth step may be, for example, 50 μm/hr or more, for example, 100 μm/hr or more, for example, 100 μm/hr to 500 μm/hr, for example, 150 μm/hr to 300 μm/hr.

An excellent growth rate of the SiC ingot 100 may be obtained because a uniform sublimation condition may be ensured by applying the raw material with the FF value of 5 to 35 and/or the amount of change in the internal friction angle of 5 to 18%.

Under the crystal growth atmosphere described above, it is more advantageous to manufacture a SiC ingot having higher quality.

Different SiC seeds 110 may be used depending on the characteristics of the SiC ingot 100 to be grown. For example, 4H-SiC, 6H-SiC, 3C-SiC, 15R-SiC, etc. may be used, but is not limited thereto.

Different SiC seeds 110 may be used depending on the size of the SiC ingot 100 to be grown. The diameter of the SiC ingot 100 may be 4 inches or more, specifically, 5 inches or more, more specifically 6 inches or more. Still more specifically, the diameter of the SiC ingot 100 may be 4 inches to 12 inches, 4 inches to 10 inches or 4 inches to 8 inches.

Various SiC seeds 110 may be used as long as it is capable of growing a 4H-SiC single crystal, for example, 4H-SiC seed, whose front surface where the SiC ingot 100 grows is C plane (000-1) may be used.

The powder 200 is vapor-transported in a crystal growth atmosphere toward the SiC seed 110, and grows the SiC ingot on the surface of the SiC seed 110.

In one embodiment, the SiC ingot 100 may contain 4H SiC, and may have a convex or flat surface.

If the shape of the surface of the SiC ingot 100 is unintentionally formed as concave, it may be because an unintended crystal having different polymorphism such as 6H-SiC is mixed with the intended 4H-SiC crystal, and it may cause deterioration of the quality of the SiC ingot 100. In addition, when the surface of the SiC ingot 100 is formed as excessively convex, cracks may occur in the ingot 100 itself or crystal may be broken during wafer processing.

Whether the SiC ingot 100 is formed as excessively convex is determined based on a degree of warpage, and the SiC ingot 100 prepared according to the present disclosure has the degree of warpage of 15 mm or less.

The degree of warpage is determined as follows. The sample, whose growth of the SiC ingot 100 has been completed, is placed on a surface plate, heights of a center and an edge of the ingot 100 are measured with a height gauge based on a back surface of the ingot 100, and the degree of warpage is determined by subtracting the height of the edge from the height of the center. A positive value for the degree of warpage means convexity, 0 means flatness, and a negative value for the degree of warpage means concavity.

Specifically, the SiC ingot 100 may have a surface having a convex shape or a flat shape and the degree of warpage may be 0 to 15 mm. The SiC ingot 100 may have the warpage of 0 mm to 12 mm, or 0 mm to 10 mm. The SiC ingot 100 having such degree of warpage is easier to be processed into wafers and may reduce occurrence of cracks.

The SiC ingot 100 may be a 4H-SiC ingot which is a substantially a single crystal whose defects and polymorphic mixing are minimized.

The SiC ingot 100 is substantially made of a 4H SiC, whose surface may be convex or flat.

The SiC ingot 100 may reduce defects that may occur in a conventional SiC ingot. By using such SiC ingot, a SiC wafer having higher quality may be provided.

The SiC ingot 100 prepared according to the method of the present disclosure has a reduced number of pits on the surface, and specifically, in the number of pits on the surface of the ingot 100 according to the present disclosure having a diameter of 4 inches or more is 10 k/cm$^2$ or less.

In the present disclosure, the pit on the surface of SiC ingot is evaluated by measuring a number of the pit per unit area (1 m$^2$) at five spots observed with an optical microscope, and then calculating an average of the number. Wherein the five spots are as follows: one spot in a center of the surface of the SiC ingot except for facets, and four spots at 3, 6, 9, and 12 o'clock located approximately 10 mm from the edge of the SiC ingot toward the center.

The SiC ingot may be processed into a SiC wafer using conventional methods. For example, an outer edge of the SiC ingot is ground using a grinding equipment for the outer edge (external grinding), sliced into constant thickness, and subsequent processing such as an edge grinding, a surface grinding, and a polishing may be performed.

The wafer having an off angle of 0 degrees with respect to the (0001) plane from the SiC ingot may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot having these characteristics has excellent crystalline properties.

The locking angle, which is related with the crystallinity of the wafer is evaluated as follows: a direction of the wafer

[11-20] is aligned with a X-ray path of a high resolution X-ray diffraction analysis system (HR-XRD system); setting angles of the X-ray source optic and the X-ray detector optic to 2θ (35 to 36 degrees); the rocking curve is determined by controlling an omega (w, or theta θ, X-ray detector optic) angle to correspond to the off angle of the wafer; and the crystallinity is evaluated from the locking angle, which is obtained from a difference between the peak angle, which is a reference angle, and two full width at half maximum (FWHM) (hereinafter, same applies to the locking angle).

In the present disclosure, an off angle of X degrees means that it has an off angle evaluated as X degrees within a general error range, and for example, it includes an off angle in a range of (X−0.05 degrees) to (X+0.05 degrees).

In the present disclosure, the locking angle "−1 to +1 degree relative to the reference angle" means that the full width at half maximum is in the range of (peak angle−1 degree) to (peak angle+1 degree) with respect to the peak angle which is the reference angle.

In addition, a surface excluding a center part and a part within 5 mm from an edge to the center is divided substantially equally into three parts, and an average value of three or more measurements in each part is determined as the locking angle.

Specifically, the omega angle is 17.8111 degree when the off angle is 0 degree, the omega angle is 13.811 degree when the off angle is 4 degree, and the omega angle is 9.8111 degree when and the off angle is 8 degree. The omega angle may be in the range of 9.8111 degree to 17.8111 degree.

Specifically, the wafer having an off angle of 4 degrees with respect to the (0001) plane of the SiC ingot 100 may have a locking angle of −1.5 degree to +1.5 degree relative to the reference angle. The wafer having an off angle of 4 degree with respect to the (0001) plane of the SiC ingot 100 may have a locking angle of −1.0 degree to +1.0 degree relative to the reference angle, or −0.5 degree to +0.5 degree relative to the reference angle. The wafer having an off angle of 4 degree with respect to the (0001) plane of the SiC ingot 100 may have a locking angle of −0.1 degree to +0.1 degree relative to the reference angle, or −0.05 degree to +0.05 degree relative to the reference angle. The ingot having these characteristics has excellent crystalline properties.

Specifically, the wafer having an off angle of 8 degrees with respect to the (0001) plane of the SiC ingot 100 may have a locking angle of −1.0 degree to +1.0 degree relative to the reference angle, or −0.5 degree to +0.5 degree relative to the reference angle. The wafer having an off angle of 8 degrees with respect to the (0001) plane of the SiC ingot 100 may have a locking angle of −0.1 degree to +0.1 degree relative to the reference angle, or −0.05 degree to +0.05 degree relative to the reference angle. The ingot having these characteristics has excellent crystalline properties.

The SiC ingot according to another embodiment has a large caliber of 4 inches or more, contains 4H SiC, and has a number of a surface pit of 10 k/cm$^2$ or less.

The wafer having an off angle of 4 degree of the SiC ingot may have a locking angle of −1.0 to +1.0 degrees relative to a reference angle. The off angle is based on the (0001) plane of 4H SiC. The SiC ingot having such characteristics has a large area and an excellent crystal quality.

The description of the SiC ingot is same as described above, and thus description thereof is omitted.

The composition of the raw material according to another embodiment is applied as a raw material for preparing a SiC ingot, and generates a flow when a predetermined pressure is applied, includes SiC particles, and has a flow factor of 5 to 35.

The description of the composition of the raw material is same as described above, and thus description thereof is omitted.

Hereinafter, while embodiments of the present disclosure will be described in more detail with reference to the accompanying examples, it should be noted that examples are not limited to the following.

EXAMPLE AND COMPARATIVE EXAMPLE

Example 1

As schematically shown in FIG. 1, a powder 200 including SiC particles was loaded inside the crucible body 310. The properties of the powder including the SiC particles were measured by the method described below, and are shown in Table 1 below.

A SiC seed crystal 100 and a seed crystal holder 110 were placed over the powder. The SiC seed crystal was fixed such that the C plane (000−1 plane) of the SiC seed crystal (4H-SiC crystal, 6 inch) is faced toward the bottom of the crucible. The same applies to the following examples 2 to 4 and comparative examples 1 to 3 below.

The crucible body in which the seed crystal 100 and the seed crystal holder 110 are placed, is covered with a crucible cover 320, wrapped with a heat insulating material 400, and then placed in a reaction chamber equipped with a heating coil 500 as a heating means.

The internal space of the crucible was depressurized to a vacuum atmosphere, and an argon gas was injected to the internal space of the crucible until an atmospheric pressure is reached, and then the internal space of the crucible was depressurized again. At the same time, the temperature of the internal space of the crucible was raised to 2300° C.

SiC ingot was grown for 100 hours under a temperature of 2300° C. and a pressure of 20 torr.

Example 2

The SiC single crystal ingot was grown in the same manner as in Example 1, except that the powder having the characteristics shown in Table 2 was used.

Example 3

The SiC single crystal ingot was grown in the same manner as in Example 1, except that the powder having the characteristics shown in Table 2 was used.

Example 4

The SiC single crystal ingot was grown in the same manner as in Example 1, except that the powder having the characteristics shown in Table 2 was used.

Example 5

The SiC single crystal ingot was grown in the same manner as in Example 1, except that the powder having the characteristics shown in Table 2 was used.

Example 6

The SiC single crystal ingot was grown in the same manner as in Example 1, except that the powder having the characteristics shown in Table 2 was used.

Comparative Examples 1

The SiC single crystal ingot was grown in the same manner as in Example 1, except that the powder having the characteristics shown in Table 2 was used.

An evaluation on the properties of SiC ingots

1) Measurement of Flow Factor (FF) and Internal Friction Angle

The powder was weighed in a 230 cc trough, and the flow factor and the internal friction angle were measured using a PFT™ equipment from Brookfield.

The flow factor (FF) is determined as follows:

After the powder is condensed by applying a predetermined pressure in the confined space (consolidation stress, CS), the confined space is released, and then the pressure at which the condensation collapses (Unconfined Failure Strength, UFS) is measured. The pressure was set to 0.5, 1, 2, 4 and 9 kPa respectively, and the results of repeated measurements are plotted. A slope of a trend line was obtained when the CS is set as X-axis and the UFS is set as Y-axis, and the flow factor was obtained as a reciprocal of the slope of the trend line (Refer to equation 1). FF may be measured using, for example, PFT™ equipment from Brookfield.

$$Y=aX+b, FF=1/a \quad \text{[Equation 1]}$$

Figure 2:
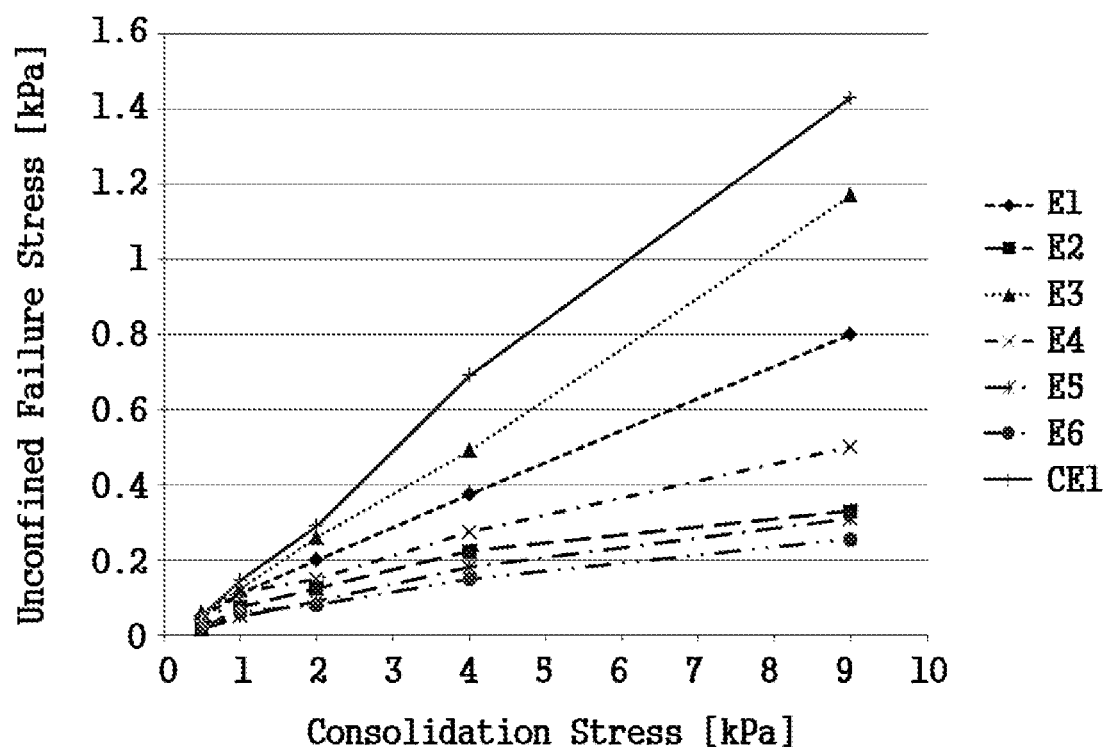
FIG. 2 is a graph showing comparison of the flow factor of the powders according to Example and Comparative Example.

In Table 1, CS, UFS, and the slope of the trend lines according to Examples and Comparative Examples are summarized, and each graph is schematically illustrated in FIG. 2.

The internal friction angle before and after compression was measured while increasing the strength of compression, and the amount of change in the internal friction angle at 8 kPa was determined. The amount of change in the internal friction angle (%) was calculated according to the Equation 2 below.

The amount of change in the internal friction angle (%)=[{(The internal friction angle before compression)−(The internal friction angle after the 8 kPa compression)}/(The internal friction angle before compression)*100] [Equation 2]

2) Measurement of Surface Pit

One spot, located at a center of the surface of the SiC ingot except for facets, and four spots, at 3, 6, 9, and 12 o'clock located approximately 10 mm from an edge of the SiC ingot toward the center. A total of five spots were measured with an optical microscope and an average value was given as a pit value as listed in Table 2 below.

3) Polymorphism

The polymorphism of the grown ingot was evaluated by UV-induced emission image analysis. When there was polymorphism, the sample was evaluated as fail and when polymorphism was not observed, it was evaluated as pass. The results are shown in Table 2.

4) Evaluation of Locking Angle:

After preparing wafers with off-angle angles shown in Table 3, which are based on a (0001) plane of the ingot, using a high resolution X-ray diffraction analysis system (HR-XRD system, Rigaku's SmartLab High Resolution X-ray Diffraction System), the [11–20] direction of the wafer was set to the X-ray path, the angle of X-ray source optic and the angle of X-ray detector optic were set to 2θ (35 to 36 degrees). The locking angle was measured by adjusting the omega (w, or theta θ, X-ray detector optic) angle to correspond to the off angle of the wafer. Specifically, the omega angle was 17.8111 degree based on 0 degree off, the omega angle was 13.811 degree based on 4 degree off, and the omega angle was 9.8111 degree based on 8 degree off.

X-ray power was 9 kW, X-ray target was Cu, and Goniometer resolution was 0.0001 degree. The FWHM was measured based on the angle at Max Intensity and evaluated as the rocking angle, respectively, and the results are shown in Table 3.

The surface excluding parts within 5 mm from a center and an edge of the wafer was divided into three parts. The following results are shown by averaging the results obtained by measuring at least three or more times for each part.

TABLE 1

| Consolidation Strength (CS, kPa) | Unconfined Failure Strength (UFS, kPa) | | | | | | |
|---|---|---|---|---|---|---|---|
| | Example 1 | Example 2 | Example 3 | Example 4 | Example 5 | Example 6 | Comparative Example 1 |
| 0.5 | 0.05 | 0.02 | 0.06 | 0.02 | 0.02 | 0.05 | 0.02 |
| 1 | 0.11 | 0.08 | 0.12 | 0.12 | 0.05 | 0.15 | 0.06 |
| 2 | 0.2 | 0.13 | 0.26 | 0.15 | 0.09 | 0.29 | 0.08 |
| 4 | 0.38 | 0.22 | 0.49 | 0.27 | 0.18 | 0.69 | 0.15 |
| 9 | 0.8 | 0.33 | 1.17 | 0.5 | 0.31 | 1.43 | 0.26 |
| Trend line slope | 0.087 | 0.035 | 0.129 | 0.053 | 0.034 | 0.163 | 0.026 |
| FF | 11.5 | 28.9 | 7.8 | 18.9 | 29.5 | 6.1 | 37.9 |

TABLE 2

| | D50 (μm) | Flow Factor (FF) | The internal friction angle before compression (°) | The internal friction angle after the 8 kPa compression (°) | The amount of change in the internal friction angle (%) | Surface Pit (k/cm²) | Polymorphism |
|---|---|---|---|---|---|---|---|
| Example 1 | 130 | 11.5 | 38.1 | 33.5 | 12.1 | 8.5 | Pass |
| Example 2 | 450 | 28.9 | 36.0 | 31.9 | 11.4 | 8.9 | Pass |
| Example 3 | 80 | 7.8 | 39.2 | 32.5 | 17.1 | 9.4 | Pass |
| Example 4 | 280 | 18.9 | 37.6 | 34.7 | 7.6 | 8.7 | Pass |

TABLE 2-continued

|  | D50 (μm) | Flow Factor (FF) | The internal friction angle before compression (°) | The internal friction angle after the 8 kPa compression (°) | The amount of change in the internal friction angle (%) | Surface Pit (k/cm²) | Polymorphism |
|---|---|---|---|---|---|---|---|
| Example 5 | 380 | 29.5 | 35.9 | 34.7 | 3.3 | 9.9 | Pass |
| Example 6 | 130 | 6.1 | 38.5 | 30.9 | 19.7 | 9.8 | Fail |
| Comparative Example 1 | 300 | 37.9 | 37.3 | 33.1 | 11.3 | 10.9 | Fail |

TABLE 3

|  | Wafer Off angle) | XRD [11-20] | |
|---|---|---|---|
|  |  | angle at Max intensity | Rocking angle |
| Example 1 | 0° | 17.811° | ±0.15° |
| Example 2 | 4° | 13.811° | ±0.07° |
| Example 3 | 4° | 13.811° | ±0.60° |
| Example 4 | 8° | 9.811° | ±0.12° |
| Example 5 | 0° | 17.811° | ±1.2° |
| Example 6 | 4° | 13.811° | ±1.7° |
| Comparative Example1 | 4° | 13.811° | ±1.8° |

Referring to Tables 1 and 2, when the FF value of the sample was 5 to 35, the surface pit was 10 k/cm² or less, and the sample showed superior properties when evaluated under the same conditions. Compared to the results where the FF value is outside the range of 7 to 32, such as 6.4 or 37.2, it was confirmed that the crystal properties of the manufactured ingot according to the embodiments of the present disclosure were excellent, since the locking angle value was remarkably small. Moreover, when the amount of change of the internal friction angle was 5% to 18%, the locking angle and the pit value were all excellent in the Examples.

The composition for preparing a SiC ingot, the method for preparing a SiC ingot using the same presented in the examples described herein may suppress mixing of heterogeneous polytypes such that it is possible to provide SiC ingots and wafers prepared therefrom having excellent quality and little or no defects.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for preparing a SiC ingot, comprising:
   loading a powder composition of a raw material comprising SiC particles into a reactor;
   placing a seed crystal on one side of the reactor spaced apart from the powder composition; and
   sublimating the powder composition such that the SiC ingot grows from the seed crystal,
   wherein a flow factor of the composition is 5 to 35,
   wherein when the powder composition is compressed by applying a pressure of 8 kPa, a ratio of a change in an internal friction angle after the compression to an internal friction angle before the compression is 5% to 18%, and
   wherein a number of a surface pit of the SiC ingot is 10 K/cm² or less.

2. The method of claim 1, wherein a $D_{50}$ of the powder composition is 10 μm to 800 μm.

3. The method of claim 1, wherein a caliber of the SiC ingot is 4 inches or more.

4. The method of claim 1, wherein a caliber of the SiC ingot is 6 inches or more.

5. The method of claim 1, wherein the SiC ingot comprises a 4H SiC single crystal.

6. The method of claim 1, wherein the SiC ingot is convex or flat.

7. A powder composition of a raw material for preparing a SiC ingot with a surface pit of 10 K/cm² or less,
   wherein the composition generates a flow when a predetermined pressure is applied,
   wherein the powder composition comprises SiC particles,
   wherein the powder composition has a flow factor of 5 to 35, and
   wherein when the powder composition is compressed by applying a pressure of 8 kPa, a ratio of a change in an internal friction angle after the compression to an internal friction angle before the compression is 5% to 18%.

\* \* \* \* \*